United States Patent [19]
Suzuki et al.

[11] Patent Number: 5,888,679
[45] Date of Patent: Mar. 30, 1999

[54] PRODUCTION PROCESS OF COLOR FILTER, COLOR FILTER PRODUCED THEREBY AND LIQUID CRYSTAL DISPLAY DEVICE USING SUCH COLOR FILTER

[75] Inventors: Hiroyuki Suzuki, Yokohama; Nagato Osano, Kawasaki; Junichi Sakamoto, Yokohama; Kenichi Iwata, Tokyo, all of Japan

[73] Assignee: Canon Kabushiki Kaisha, Tokyo, Japan

[21] Appl. No.: 46,434

[22] Filed: Mar. 24, 1998

[30] Foreign Application Priority Data

Mar. 27, 1997  [JP]  Japan ................................. 9-074732

[51] Int. Cl.⁶ .......................... G02B 5/20; G02F 1/1335
[52] U.S. Cl. .................................. 430/7; 349/106
[58] Field of Search .................. 430/7, 330, 321; 349/106, 110

[56] References Cited

U.S. PATENT DOCUMENTS 5,609,943  3/1997  DeKoven et al. ..................... 430/7
5,691,011  11/1997  Newsham et al. .................. 349/106

FOREIGN PATENT DOCUMENTS 3-120516  5/1991  Japan .
6-347637  12/1994  Japan .

*Primary Examiner*—John A. McPherson
*Attorney, Agent, or Firm*—Fitzpatrick, Cella, Harper & Scinto

[57] ABSTRACT

Disclosed herein is a process for producing a color filter, which comprises the steps of forming a resin layer on a substrate, pre-curing the resin layer, exposing the resin layer, developing the resin layer to form black matrices between which space areas are defined, heating the black matrices under reduced pressure and separately applying inks to the space areas.

10 Claims, 4 Drawing Sheets

1

PRODUCTION PROCESS OF COLOR FILTER, COLOR FILTER PRODUCED THEREBY AND LIQUID CRYSTAL DISPLAY DEVICE USING SUCH COLOR FILTER

BACKGROUND OF THE INVENTION

1. Field of the Invention

With the advancement of personal computers, particularly, the advancement of portable personal computers in recent years, the demand for liquid crystal display, particularly, color liquid crystal display tends to increase. It is however necessary to reduce the cost of the color liquid crystal display devices for further spreading them. There is an increasing demand for reduction in the cost of color filter substrates particularly given much weight from the viewpoint of the cost.

2. Related Background Art

As a process for producing a color filter substrate at low cost, it has been proposed to first form light-screening black matrices on a glass substrate and separately applying inks to space areas between the black matrices by an ink-jet system to form a color filter. With respect to this process, in order to successfully fill the inks in the space areas between the black matrices, which correspond to respective pixels, a material hard to wet with the inks and easy to repel the inks are investigated as a material for the black matrices.

For example, Japanese Patent Application Laid-Open No. 7-35917 has proposed a process in which black matrices are formed with a material having a contact angle with inks of at least 20°, and the inks are applied to space areas between the black matrices. In Japanese Patent Application Laid-Open No. 7-35915, it has also been proposed to use a material having a contact angle with water of at least 40° as a material for black matrices. In Japanese Patent Application Laid-Open No. 6-347637, it has been proposed to select materials for a substrate, inks and black matrices, the critical surface tensions of which shall be lined up in the order of "the substrate surface>the inks>the black matrix surface", and be preset in such a manner that that of the black matrix surface is lower than 35 dyn/cm, that of the substrate surface is not lower than 36 dyn/cm, and the inks have a difference in the critical surface tension by at least 5 dyn/cm from both substrate surface and black matrix surface. In all these proposals, it has been proposed to contain a fluorine compound or a silicon compound in materials for the black matrices to impart a high ink repellency to the materials.

Besides, in Japanese Patent Application Laid-Open No. 4-121702, it has been proposed to form banks having a hydrophilicity opposite to a substrate and to pour inks in spaces between the banks. However, detailed description as to materials is not made.

By imparting the ink repellency to the black matrices like these examples, it is possible to repel any inks flown off on the black matrices back to the space areas between the black matrices. Therefore, the problem that the inks are not successfully filled in the space areas corresponding to the respective pixels has been solved.

The above prior art examples are such that light-screening partitions (black matrices) are formed with a material different in critical surface tension from materials (inks) for a color filter, and the inks are applied to space areas between the partitions.

However, the materials described in these examples involve a problem in the following respects.

In the case of black matrices formed of a resin composition mainly containing a photosensitive resin, a non photosensitive resin, a black color-imparting material and an ink repellent (water repellent), the resin components and ink repellent in the resin composition, from which the black matrices are formed, are evaporated upon post-baking, which is a final step for forming the desired black matrix pattern, to thinly attach to the surface of a substrate. Therefore, the surface of the substrate also comes to exhibit an ink repellency, and inks applied to the substrate are hence difficult to adhere thereto and do not fully spread over the portions of the substrate surface corresponding to the space areas between the black matrices, resulting in a color filter which has blank areas (white portions) or irregularities or shows a tendency for the colored portions to separate from the substrate.

SUMMARY OF THE INVENTION

It is therefore an object of the present invention to provide a production process of a color filter, which can solve the above-described problems and has a high reliability in that surface portions of a substrate exposed at space areas between black matrices are prevented from possessing ink repellency to improve the adhesion property of color inks applied to the space areas to the surface of the substrate, a color filter produced by this process, and a liquid crystal display device using this color filter.

The above object can be achieved by the present invention described below.

According to the present invention, there is thus provided a process for producing a color filter, which comprises the steps of forming a resin layer on a substrate; pre-curing the resin layer; exposing the resin layer; developing the resin layer to form black matrices between which space areas are defined; heating the black matrices under reduced pressure; and separately applying inks to the space areas.

According to the present invention, there is also provided a color filter produced by the production process described above.

According to the present invention, there is further provided a liquid crystal display device comprising a substrate having the color filter produced by the production process described above and an electrode, an opposite substrate which is arranged in an opposing relation to the color filter and has an electrode, and a liquid crystal compound enclosed in a space between the color filter substrate and the opposite substrate.

DETAILED DESCRIPTION OF THE PREFERRED EMBODIMENTS

The present invention will hereinafter be described in detail by reference to the drawings.

Figure 1:
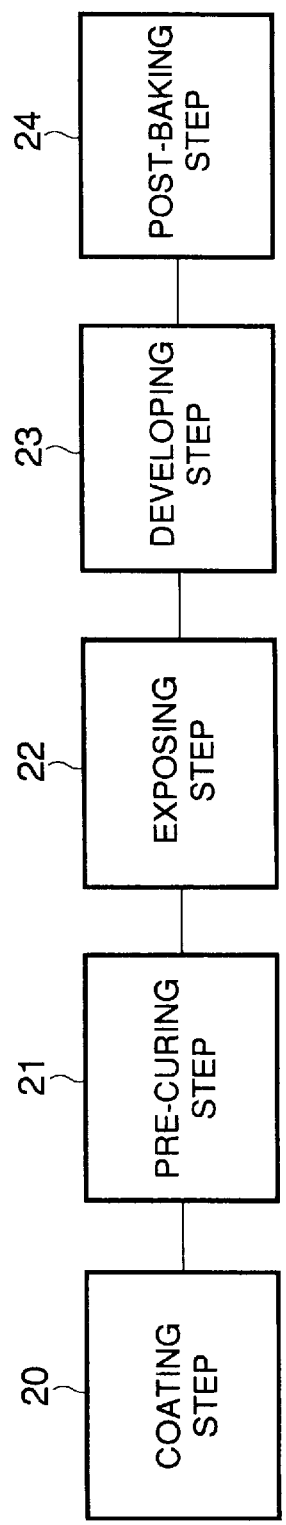
FIG. 1 illustrates steps of a production process according to the present invention.
Figure 2A:
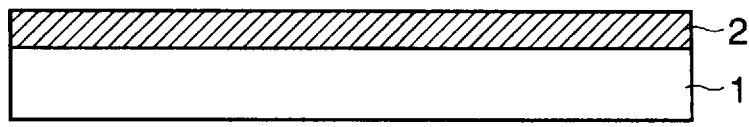
FIGS. 2A, 2B, 2C, 2D and 2E are cross-sectional views illustrating an exemplary process of the production of a color filter according to the present invention in order of steps.

In a coating step 20 illustrated in FIG. 1, a photosensitive resin composition comprising a black color-imparting material is first applied to a transparent substrate 1 to form a photosensitive resin layer 2 (FIG. 2A). As a coating method, various methods such as spin coating, die coating, dip coating and spray coating may be used. The thickness of the coated film is a thickness sufficient to obtain necessary light-screening ability and is, for example, about 1 µm. As the transparent substrate 1, a glass sheet is often used. However, a plastic film or sheet formed of polyethylene terephthalate or polycarbonate may also be used.

The photosensitive resin composition comprises a pigment or dye as the black color-imparting material and a photosensitive resin and may optionally contain a non photosensitive resin. The photosensitive resin composition is dispersed in a proper solvent when it is applied to the substrate.

Carbon black or a black organic pigment may be used as the black pigment. Red, green and blue pigments or dyes may also be used in combination.

The photosensitive resin may be suitably chosen for use from among UV resists, deep-UV resists, ultraviolet-curing resins and the like.

Examples of the UV resists include negative resists such as cyclized polyisoprene-aromatic bis azide type resists and phenol resin-aromatic azide compound type resists, and positive resists such as novolak resin-diazonaphthoquinone type resists.

Examples of the deep-UV resists include positive resists, such as radiation-decomposable polymer resists such as poly(methyl methacrylate), poly(styrene sulfone), poly (hexafluoro butyl methacrylate), poly(methyl isopropenyl ketone) and brominated poly(1-trimethylsilylpropyl), and dissolution inhibitor type positive resists such as o-nitrobenzyl cholates; and negative resists such as poly (vinylphenol-3,3-diazide phenyl sulfone) and poly(glycidyl methacrylate).

Examples of the ultraviolet-curing resins include polyester acrylates, epoxy acrylates and urethane acrylates, which contain about 2 to 10% by weight of one or more photopolymerization initiators selected from the group consisting of benzophenone and substituted derivatives thereof, benzoin and substituted derivatives thereof, acetophenone and substituted derivatives thereof, and oxime compounds such as benzil.

In a pre-curing step 21 illustrated in FIG. 1, the layer 2 of the photosensitive resin composition applied is pre-cured by means of, for example, a hot plate. When the hot plate is used in the pre-curing, a heating temperature is preferably within a range of from 60° to 120° C., more preferably from 80° to 105° C. Heating time is preferably within a range of from 30 to 150 seconds, more preferably from 60 to 90 seconds.

In the pre-curing step, the pre-curing may be conducted by vacuum drying in place of the heating. In the case of the vacuum drying, a degree of vacuum is preferably within a range of from 5 to 2,660 Pa, more preferably from 10 to 1,000 Pa. The vacuum drying is preferably conducted for 3 to 60 seconds, more preferably 5 to 30 seconds. The vacuum drying can save time compared with the case where the hot plate is used.

Figure 2B:
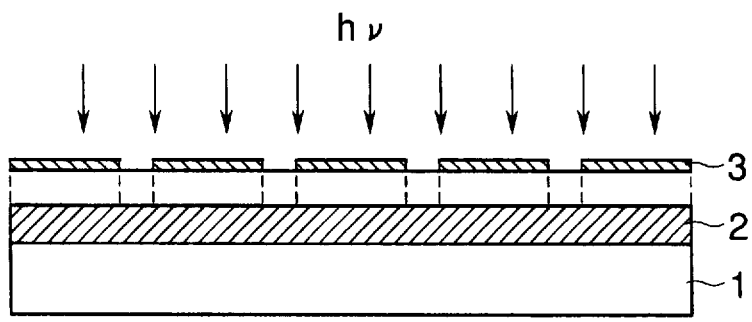

The substrate 1 to which the photosensitive resin layer 2 has been applied is then transferred to an exposing step 22 illustrated in FIG. 1. In the exposing step 22, the photosensitive resin layer 2 is exposed to light through a mask 3 having a predetermined pattern (FIG. 2B). A mercury vapor lamp is preferably used as a source of exposure.

The exposed photosensitive resin layer 2 is then developed with an aqueous solution of an inorganic alkali using a developer in a developing step 23. When the photosensitive resin layer 2 is of a negative type, portions of the photosensitive resin layer 2, which have been screened by the mask 3 upon the exposure, are dissolved out in the developing solution. When the photosensitive resin layer 2 is of a positive type on the other hand, portions of the photosensitive resin layer 2, which have been exposed, are dissolved out in the developing solution. The developing solution is not limited to the aqueous solution of the inorganic alkali and may be either an aqueous solution of an organic alkali or an organic solvent such as propylene glycol monomethyl ether acetate, ethyl cellosolve or alcohol.

Figure 2C:
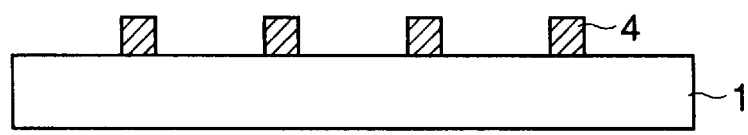

Thereafter, the thus-developed photosensitive resin layer 2 is rinsed with, for example, purified water to wash out the developing solution. In such a manner, black matrices 4 between which space areas are defined are formed on the substrate 1 (FIG. 2C).

The substrate 1 on which the black matrices have been formed is then transferred to a post-baking step 24 illustrated in FIG. 1 and post-baked.

Figure 3:
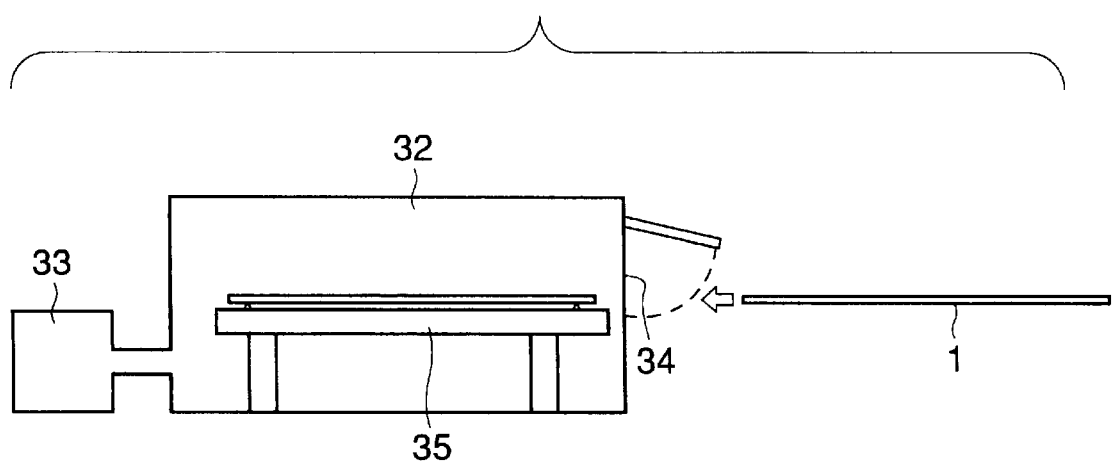
FIG. 3 is a side elevation view illustrating an exemplary vacuum hot plate used in the production process of the present invention.

In the post-baking step 24, the black matrices 4 are heated under reduced pressure by means of a vacuum hot plate illustrated in FIG. 3 and cured.

Referring to FIG. 3, the substrate 1 on which the black matrices have been formed is first put in a vacuum chamber 32 in a state that a charging door 34 has been opened (in FIG. 3, the black matrices 4 are omitted). The substrate 1 is then situated at a predetermined position on a hot plate 35 within the vacuum chamber 32. At this time, the substrate 1 may be placed either directly on the hot plate 35 or with a predetermined distance kept from the hot plate 35 by means of a jig such as pins. After placing the substrate 1, the charging door 34 is closed to start evacuating the vacuum chamber by a vacuum pump 33, and at the same time heating the hot plate 35 and the substrate 1 placed thereon by a heater installed within the hot plate 35. The evacuating and heating are stopped after a little while from the time their conditions have reached respective predetermined set points, so as to permit removal of the substrate 1 outside the apparatus.

Thereafter, the substrate 1 is removed through the charging door 34 outside the apparatus to complete the post-baking step. Incidentally, this apparatus may also be used as a vacuum drying apparatus in the pre-curing step without heating the hot plate 35.

A degree of vacuum in the post-baking step 24 is preferably within a range of from 5 to 2,660 Pa, more preferably from 10 to 1,000 Pa. A heating temperature is preferably within a range of from 150° to 240° C., more preferably from 180° to 230° C. Evacuating time is preferably within a range of from 10 to 600 seconds, more preferably from 150 to 400 seconds.

The post-baking by the heating under reduced pressure as described above can prevent volatile components generated from the black matrices from adhering to the exposed surface of the substrate. Therefore, inks can be steadily adhered to the substrate in a subsequent ink-applying step. The heating under reduced pressure can save time compared with heating under atmospheric pressure. Further, the heating under reduced pressure permits evenly heating the whole surface of the substrate.

Figure 2D:
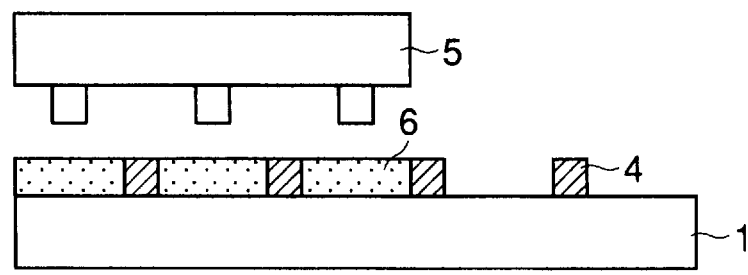

After completion of the post-baking, inks 6 of R (red), G (green) and B (blue) colors or the like are applied to the space areas between the black matrices 4 using an ink-jet apparatus 5 (FIG. 2D). As a method for applying the inks, a commonly used printing method such as offset printing, gravure printing or screen printing may also be used in the present invention. However, it is particularly preferable to use an ink-jet system in that since no plate is used upon printing, high-precision patterning can be performed. As the ink-jet system, a bubble-jet type making use of an electro-thermal converter as an energy-generating element or a piezo-jet type making use of a piezoelectric element may be used.

The color inks used in the present invention may preferably thermosetting or photo-setting resin compositions for the purpose of finally serving as color filter elements. Therefore, such inks may preferably contain a polyester acrylate, a monomer such as epoxy acrylate or urethane acrylate, or an oligomer thereof.

Such color inks used in the present invention may be either dye-based inks or pigment-based inks. The solvent for the inks is composed mainly of purified water (ion-exchanged water) and may contain a hydrophilic organic solvent and the like. Examples of dyes used include C.I. Acid Red 118, C.I. Acid Red 254, C.I. Acid Green 25, C.I. Acid Blue 113, C.I. Acid Blue 185 and C.I. Acid Blue 7. However, the dyes used are not limited to these dyes.

Examples of pigments used include C.I. Pigment Red 177, C.I. Pigment Red 5, C.I. Pigment Red 12, C.I. Pigment Green 36, C.I. Pigment Blue 209 and C.I. Pigment Blue 16. However, the pigments used are not limited to these pigments.

The dyes or pigments contained in the color inks used in the ink-jet system may preferably be used in a proportion ranging from 0.1 to 20% by weight based on the total weight of the ink.

Examples of the hydrophilic organic solvent used in the color inks include alkyl alcohols having 1 to 4 carbon atoms, such as methyl alcohol and ethyl alcohol; amides such as dimethylformamide and dimethylacetamide; ketones and keto-alcohols such as acetone and diacetone alcohol; ethers such as tetrahydrofuran and dioxane; polyalkylene glycols such as polyethylene glycol and polypropylene glycol; alkylene glycols the alkylene moiety of which has 2 to 6 carbon atoms, such as ethylene glycol, propylene glycol, butylene glycol, thiodiglycol and diethylene glycol; glycerol; lower alkyl ethers of polyhydric alcohols, such as ethylene glycol monomethyl (or monoethyl) ether, diethylene glycol monomethyl (or monoethyl) ether and triethylene glycol monomethyl (or monoethyl) ether; N-methyl-2-pyrrolidone; 2-pyrrolidone; and 1,3-dimethyl-2-imidazolidinone. However, the solvents used are not limited to these solvents.

In the present invention, the surface energy of the color inks is preferably within a range of from about 30 to 70 dyn/cm. Namely, the black matrices are preferably formed of a material hard to wet with the inks so as to prevent a color ink from flowing over a black matrix and mixing with another color ink in an adjacent space area. It is thus preferable that the surface energy of the black matrices be lower than that of the color inks.

Figure 2E:
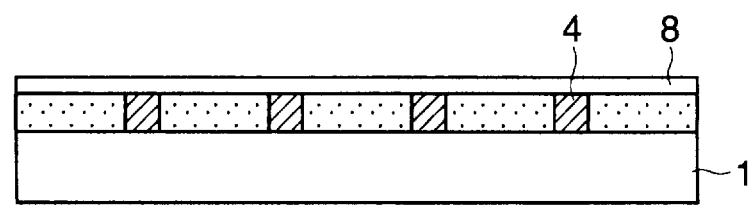

After the color inks 6 are cured to form a color filter, a protective layer 8 is further formed as needed (FIG. 2E). As the protective layer 8, may be used a resin material of the photo-setting type, thermosetting type or light- and heat-curing type, or an inorganic film formed by vacuum deposition or sputtering. Any material may be used so far as it has sufficient transparency to be used in a color filter and withstands subsequent processes, for example, ITO film-forming process and alignment film-forming process in the case where a liquid crystal display device is fabricated.

In the above embodiment, the black matrices have been formed with the photosensitive resin composition. However, the black matrices may also be formed with a nonphotosensitive resin composition. For example, polyimide, an acrylic monomer or urethane acrylate is dispersed in a proper solvent, and the dispersion is applied to a substrate. In this case, a black matrix pattern can be formed by forming a coating film of the black non photosensitive resin composition in a thickness of about 1 μm on the substrate and etching the nonphotosensitive resin composition using a photoresist as a mask. The pattern may also be formed by lift-off using a photoresist.

Figure 4:
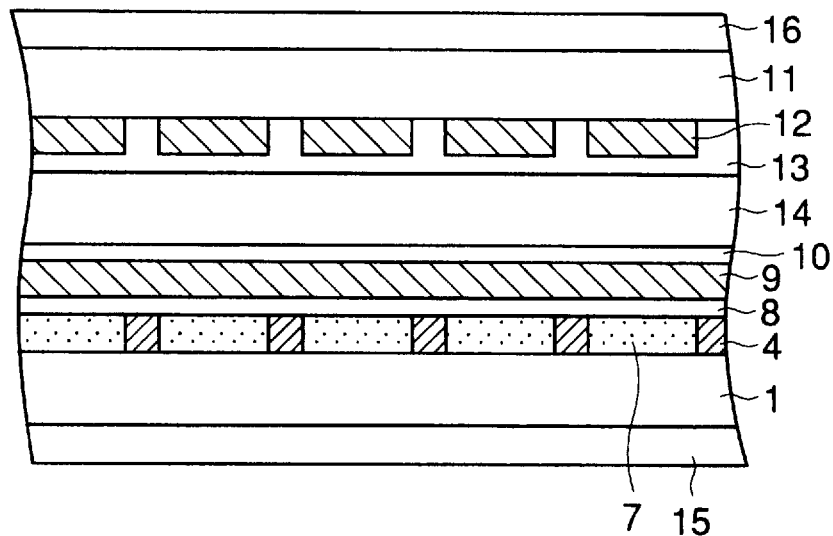
FIG. 4 is a cross-sectional view of a liquid crystal display device according to an embodiment of the present invention.

An example of a color liquid crystal display device in which a color filter produced in accordance with the production process of the present invention is incorporated will hereinafter be described with reference to FIG. 4.

The color liquid crystal display device according to this embodiment is generally formed by uniting a color filter substrate and a substrate opposite thereto and enclosing a liquid crystal compound in a space between them. A common (counter) electrode 9 is formed inside the color filter substrate. On the side of the substrate opposite to the color filter substrate, TFT (not illustrated) and transparent pixel electrodes 12 are formed inside a transparent substrate 11 in the form of a matrix so as to correspond to individual color filter elements. Alignment films 10 and 13 are further formed at respective interfaces between both substrates and a liquid crystal compound 14. Liquid crystal molecules can be aligned in a fixed direction by subjecting these films to a rubbing treatment.

The color liquid crystal display device is fabricated by bonding both substrates to each other with a sealant (not illustrated) and enclosing the liquid crystal compound in a space (about 2 to 5 μm) between them. Further, polarizing plates 15 and 16 are bonded to the outer surfaces of the respective substrates 1 and 11. As a back light, a combination of a fluorescent lamp and a scattering plate (both, not shown) is generally used. The liquid crystal compound functions as a shutter for changing the transmittance of rays from the back light, thereby making a display. Incidentally, reference numerals 4, 7 and 8 designate a black matrix, a colored pixel and a protective film, respectively.

The present invention will hereinafter be described in more detail by the following Examples.

EXAMPLE 1

A resist material (negative resist ink for black matrices, BK739P, trade name, product of Nippon Steel Chemical Co., Ltd.) comprising a black color-imparting material was applied by a spin coater to a glass substrate which had been subjected to alkali cleaning and then to an UV-ozone treatment, so as to give a coating thickness of 1.2 μm. This substrate was heated at 90° C. for 60 seconds on a hot plate to pre-cure the resist material. The resist film thus formed was subjected to a proximity exposure through a mask having a predetermined pattern by means of an ultraviolet aligner and then developed with a developing solution composed of an aqueous solution of an inorganic alkali using a spin developer, thereby forming a black matrix pattern. The thus-developed resist film was then rinsed with purified water to completely remove the developing solution. The thus-treated substrate was then heated at 200° C. for 10 minutes in a vacuum chamber to completely cure the resist by post-baking. At this time, a degree of vacuum in the vacuum chamber was 700 Pa.

With respect to this substrate, the contact angle of the black matrix surface with water was measured. As a result, it was found that the contact angle is 70° and the surface is hence in a water-repellent state. On the other hand, the contact angle of the glass substrate surface with water was 18°, and so its surface condition differed much from that of the black matrix surface.

Dye-based inks of red (R), green (G) and blue (B) colors were applied to space areas between the black matrices using an ink-jet apparatus to color portions of the substrate surface corresponding to the space areas. These inks each had surface energy of 32 dyn/cm. The color inks fully wetted the substrate surface at the space areas between the black matrices and spread over the portions. Therefore, none of bleeding, runout, color mixing between adjacent inks of different colors, and blank areas at pixel parts were observed. After the thus-colored substrate was then heated to set the color inks and facilitate their fixing to the glass substrate, a protective film composed of an acrylic transparent resin (SS-6500, trade name, product of Japan Synthetic Rubber Co., Ltd.) was formed on the color filter layer, and a transparent conductive film composed of ITO was formed on the protective film. Even in such a case, the ink adhesion of the substrate surface was excellent, and so no inconvenience arose.

The color filter substrate thus produced was used to fabricate a liquid crystal display device. As a result, a liquid crystal display device free of any defect and excellent in color properties was provided.

EXAMPLE 2

A glass substrate coated with the black resist in the same manner as in Example 1 was pre-dried in a vacuum drying apparatus. At this time, the drying was carried out by holding the substrate for 5 seconds at room temperature and a degree of vacuum of 13 Pa and then recovering the pressure to atmospheric pressure. Thereafter, exposure, development and rinsing were conducted in the same manner as in Example 1 to obtain a glass substrate on which a black matrix pattern was formed. Unevenness of baking was scarcely observed due to the vacuum drying compared with the ordinary drying by a hot plate.

Further, post-baking was carried out by heating the substrate thus treated under reduced pressure at 180° C. for 6 minutes in a vacuum chamber to completely cure the resist. At this time, a degree of vacuum was 133 Pa.

With respect to this substrate, the contact angle of the black matrix surface with water was measured. As a result, it was found that the contact angle is 75° and the surface is hence in a very water-repellent state. On the other hand, the contact angle of the glass substrate surface with water was 12°, and so its surface condition differed much from that of the black matrix surface. The adhesion test (pressure cooker test) of this substrate resulted in about a three-fold increase (several tens hours) of adhesion time due to the post-baking by the vacuum hot plate compared with the post-baking by a hot air-circulating oven under atmospheric pressure.

Dye-based inks of red (R), green (G) and blue (B) colors were applied to space areas between the black matrices using an ink-jet apparatus to color portions of the substrate surface corresponding to the space areas. These inks each had surface energy of 32 dyn/cm. The color inks fully wetted the substrate surface at the space areas between the black matrices and spread over the portions. Therefore, none of bleeding, runout, color mixing between adjacent inks of different colors, and blank areas at pixel parts were observed. After the thus-colored substrate was then heated to set the color inks and facilitate their fixing to the glass substrate, a transparent conductive film composed of ITO was formed on the color filter layer. Even in such a case, the ink adhesion of the substrate surface was excellent, and so no inconvenience arose.

The color filter substrate thus produced was used to fabricate a liquid crystal display device. As a result, a liquid crystal display device free of any defect and excellent in color properties was provided.

EXAMPLE 3

A glass substrate prepared in the same manner as in Example 2, on which a black matrix pattern was formed, was heated under reduced pressure at 230° C. for 3 minutes in the vacuum chamber to completely cure the resist. At this time, a degree of vacuum was 13 Pa.

With respect to this substrate, the contact angle of the black matrix surface with water was measured. As a result, it was found that the contact angle is 68° and the surface is hence in a water-repellent state. On the other hand, the contact angle of the glass substrate surface with water was 16°, and so its surface condition differed much from that of the black matrix surface.

Dye-based inks of red (R), green (G) and blue (B) colors were applied to space areas between the black matrices using an ink-jet apparatus to color portions of the substrate surface corresponding to the space areas. These inks each had surface energy of 32 dyn/cm. The color inks fully wetted the substrate surface at the space areas between the black matrices and spread over the portions. Therefore, none of bleeding, runout, color mixing between adjacent inks of different colors, and blank areas at pixel parts were observed. After the thus-colored substrate was then heated to set the color inks and facilitate their fixing to the glass substrate, a transparent conductive film composed of ITO was formed on the color filter layer. Even in such a case, the ink adhesion of the substrate surface was excellent, and so no inconvenience arose.

The color filter substrate thus produced was used to fabricate a liquid crystal display device. As a result, a liquid crystal display device free of any defect and excellent in color properties was provided.

COMPARATIVE EXAMPLE 1

A glass substrate prepared in the same manner as in Example 1, on which a black matrix pattern was formed, was heated at 230° C. for 90 minutes in a hot air-circulating oven under atmospheric pressure to completely cure the resist.

As a result, it was found that the contact angle of the black matrix surface with water is 70°, while the contact angle of the glass substrate surface at spaces between the black matrices with water is 68°, and so did not differ much from that of the black matrix surface.

The color inks were applied to space areas between the black matrices in the same manner as in Example 1. However, the inks were repelled at the glass substrate surface corresponding to the space areas, and so the inks could neither sufficiently wet the glass substrate surface at the space areas nor spread over the portions, resulting in occurrence of blank areas at margins of the space areas.

As described above, the production process of the present invention can prevent volatile components generated from black matrices upon post-baking thereof from adhering to the surface of a transparent substrate when color inks are applied to space areas between the black matrices to form a color filter. Therefore, the surface energy of the transparent substrate at the space areas is kept high, so that the inks applied satisfactorily spread over the portions of the substrate surface corresponding to the space areas. There is thus provided a color filter with high reliability without separation of colored portions from the substrate and occurrence of blank areas. In addition, a liquid crystal display device excellent in color properties is provided by using this color filter.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A process for producing a color filter, which comprises the steps of:

forming a resin layer on a substrate;

pre-curing the resin layer;

exposing the resin layer;

developing the resin layer to form black matrices between which space areas are defined;

heating the black matrices under reduced pressure; and separately applying inks to the space areas.

2. The process according to claim 1, wherein the resin layer is pre-cured by a hot plate.

3. The process according to claim 1, wherein the resin layer is pre-cured by vacuum drying.

4. The process according to claim 1, wherein a degree of vacuum upon the heating under reduced pressure falls within a range of from 5 to 2,660 Pa.

5. The process according to claim 4, wherein a degree of vacuum upon the heating under reduced pressure falls within a range of from 10 to 1,000 Pa.

6. The process according to claim 4, wherein a temperature upon the heating under reduced pressure falls within a range of from 150° to 240° C.

7. The process according to claim 6, wherein a temperature upon the heating under reduced pressure falls within a range of from 180° to 230° C.

8. The process according to claim 6, wherein the inks are applied to the space areas by an ink-jet system.

9. A color filter produced by the production process according to claim 1.

10. A liquid crystal display device comprising a substrate having the color filter produced by the production process according to claim 1 and an electrode, an opposite substrate which is arranged in an opposing relation to the color filter and has an electrode, and a liquid crystal compound enclosed in a space between the color filter substrate and the opposite substrate.

* * * * *